United States Patent [19]
Mitsui et al.

[11] Patent Number: 6,087,047
[45] Date of Patent: *Jul. 11, 2000

[54] PHASE SHIFT MASK AND PHASE SHIFT MASK BLANK

[75] Inventors: Hideaki Mitsui; Osamu Nozawa; Megumi Takeuchi, all of Tokyo, Japan

[73] Assignee: Hoya Corporation, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/153,027

[22] Filed: Sep. 15, 1998

[30] Foreign Application Priority Data

Dec. 19, 1997 [JP] Japan .................................. 9-365324
Jun. 12, 1998 [JP] Japan .................................. 10-181452

[51] Int. Cl.[7] ....................................................... G03F 9/00
[52] U.S. Cl. ................................................................ 430/5
[58] Field of Search ............................... 430/5, 322, 323, 430/324

[56] References Cited

U.S. PATENT DOCUMENTS 4,460,831  7/1984  Oettinger et al. .................... 250/492.2
5,631,109  5/1997  Ito .............................................. 430/5
5,897,977  4/1999  Carcia et al. ............................... 430/5

FOREIGN PATENT DOCUMENTS

5-127361  5/1993  Japan .
6-332152  12/1994  Japan .
7-261370  10/1995  Japan .

*Primary Examiner*—S. Rosasco
*Attorney, Agent, or Firm*—Sughrue, Mion, Zinn, Macpeak & Seas, PLLC

[57] ABSTRACT

In a half-tone type phase shift mask blank in which a semi-transparent film is formed on a transparent substrate, and the semi-transparent film serves to shift phase of a first optical light beam which transmits the semi-transparent film for a second optical light beam which directly transmits the transparent substrate and further, serves to reduce strength of the first optical light beam, the semi-transparent film includes silicon and nickel, and at least one selected from the group consisting of nitrogen, oxygen and hydrogen, and the relationship between the silicon and the nickel is specified by a formula in which a rate of [atom % of the nickel in the film] for [atom % of the nickel in the film+atom % of the silicon in the film] falls within the range between 0.15 and 0.5.

25 Claims, 2 Drawing Sheets

PHASE SHIFT MASK AND PHASE SHIFT MASK BLANK

BACKGROUND OF THE INVENTION

This invention relates to a phase shift mask for use in exposing and transferring a fine pattern and a phase shift mask blank as a base material thereof, and in particular, to a half-tone type phase shift mask and a phase shift blank thereof.

Recently, high integration of a DRAM (Dynamic Random Access Memory) has been transferred from 1 Mbit into 64 Mbit or 256 Mbit. In this event, mass-production of the DRAM of the 64 Mbit or the 256 Mbit has been established in the recent years. With such a technology advancement of the DRAM, an exposure optical source has been shortened in wavelength from g line (436 nm) into i line (365 nm) in the known mercury lump of super high pressure.

Now, development has been made about shortness of exposure wavelength to achieve further high integration.

Herein, although the shortness of the exposure wavelength serves to improve resolution, focal depth is inevitably reduced. This increases design load of an exposure optical system, remarkably reduces process stability, and further gives an adverse effect for manufacturing yield.

The known phase shift method is one of methods of transferring a super resolution pattern for effectively resolving the above-mentioned problems. In such a phase shift method, a phase shift mask is used as a mask for transferring the fine pattern.

For instance, the phase shift mask is composed of phase shifter portions which form pattern portions on a mask and non-pattern portions (namely, substrate exposing portions) which have no phase shifters.

With such a structure, phases of light beams which transmit through the phase shifter portions and the non-pattern portions are deviated with about 180° to each other. Thereby, the light beams are mutually interfered at border portions of every patterns. In consequence, contrast of the transferred image is enhanced.

Further, it is possible to increase the focal depth to obtain the required resolution by the use of the phase shift method. Moreover, both resolution and process applicability can be enhanced by using the light beam having the same wavelength, as compared to the transferring process using the normal mask having a general shielding pattern of a chromium film.

In the meanwhile, the phase shift mask is practically and generally classified into the perfect-transmit type phase shift mask (namely, Shibuya, Lebenson type) and the half-tone type phase shift mask. The former has optical transmittance equivalent to the non-pattern portion (namely, the substrate-exposing portion), and is an approximately transparent mask for exposure wavelength, and is generally effective to transfer the line and space.

On the other hand, the latter has the optical transmittance of about several % to several tens % for the non-pattern portion (the substrate exposing portion) in the phase shifter portion, and is effective for fabricating a contact hole or an isolated pattern in a semiconductor manufacturing process.

Figure 1:
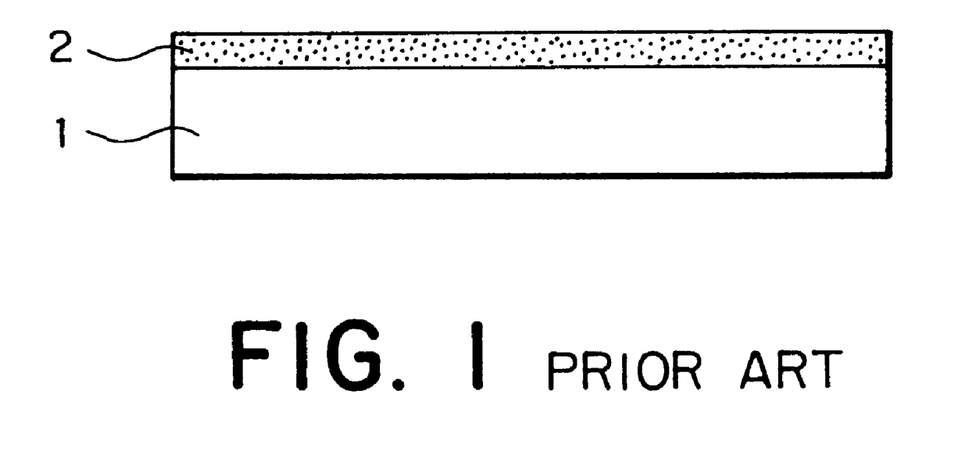
FIG. 1 is a schematic cross sectional view showing a conventional phase shift mask blank of half tone type.
Figure 2:
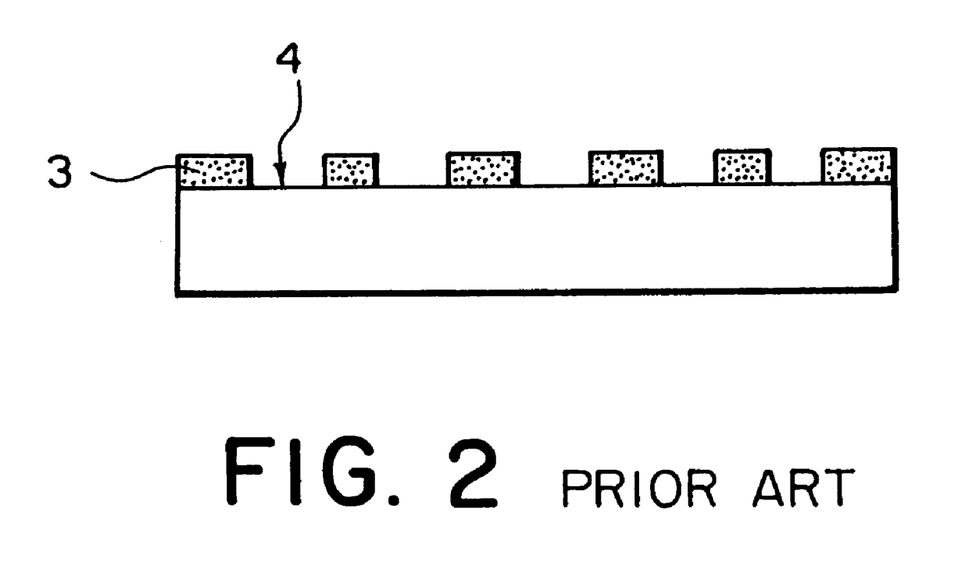
FIG. 2 Is a schematic cross sectional view showing a conventional phase shift mask of half tone type.

In this case, basic structures of the half-tone type phase shift mask blank and the half-tone type phase shift mask are illustrated in FIGS. 1 and 2, respectively. Herein, the half-tone type phase shift mask may be thereinafter abbreviated as a phase shift mask while the half-tone type phase shift mask blank may be thereinafter abbreviated as a phase shift mask blank.

In this event, a reflection-preventing layer and an etching stop layer, which may be used in the lithography process, are omitted.

The phase shift mask blank is formed by depositing a semi-transparent film 2 (namely, a half-tone phase shifter film) on a transparent substrate 1, as illustrated in FIG. 1.

On the other hand, the phase shift mask is composed of the phase shifter portions 3 which form the pattern portions on the mask and the non-pattern portions 4 (the substrate exposing portions) which have no phase shifter, as illustrated in FIG. 2.

In this condition, the phase shifter portion 3 serves as a phase shifter by shifting phase of an exposure light beam which transmits a portion around the edge thereof, and further serves to substantially shield the exposure light beam for a resist on a substrate to be transferred. In this case, the phase shift mask is a single layer type. Herein, the single layer type is simple in structure, and further easy in fabrication.

Such a single layer type is a phase shifter consisting of a chromium based material, such as, $CrO_X$, $CrN$, $CrO_XN_Y$, and $Cr_XON_YC_2$, which is disclosed in Japanese Unexamined Patent Publication No. H5-127361.

Further, the single layer type may be a phase sifter consisting of a MoSi based material, such as, MoSiO and MoSiON, which is disclosed in Japanese Unexamined Patent Publication No. H6-332152.

Moreover, the single layer type may be a phase sifter consisting of a SiN based material or a SiO based material, which is disclosed in Japanese Unexamined Patent Publication No. H7-261370.

In recent years, the phase shift mask has been voluntarily used with the shortness of the exposure wavelength. Recently, the krypton fluoride (KrF) excimer laser light beam (248 nm) is often used as a light beam which has wavelength shorter than the i line.

Further, suggestion has been made about using the argon fluoride (ArF) excimer laser light beam (193 nm) or the argon chloride (ArCl) excimer laser light beam (175 nm).

With such shortness of the exposure wavelength, it is important to control optical factors, such as transmittance and refractive index of the exposure wavelength to be used in the corresponding phase shift mask and phase shift mask blank.

It is remarkably difficult to control the desired transmittance in shorter region in wavelength than 250 nm with respect to many substances. This is because absorption degree of the light beam remarkably becomes large different from a region between visible region and near violet region. Therefore, the phase shift mask itself for the i line can not be generally used as the phase shift mask for the exposure light beam having wavelength shorter than 250 nm.

Under this circumstance, the setting of the transmittance of the phase shifter is determined by sensitivity of the resist used in a pattern transferring process and a patterning process.

For instance, it is desirable that the transmittance of the exposure light beam can be controlled within the range between 3% and 20% in a film thickness of the phase shifter which shifts the phase of the exposure light beam to the reselected angle in case of the phase shift mask.

Even when the above-mentioned basic requirement characteristics, such as the transmittance and the refractive index for the exposure wavelength are satisfied in accordance with the shortness of the exposure wavelength, inspection can not be carried out when the transmittance for the wavelength (for example, 364 nm, 488 nm, and 633 nm) of an inspection light beam is high.

Consequently, it is not suitable for the practical use. Therefore, it is required to control the transmittance for the wavelength of the inspection light beam to the desired value for the practical use.

Further, the following characteristics are required in addition to the above-mentioned characteristics for the phase shift mask and the phase shift mask blank.

Namely, it is necessary that they are stable for irradiating the used excimer laser light beam (resistance to light beam), that they have chemical durability for a washing process (resistance to chemical agent) requisite to the mask process, and that fine defects in the blank, which remarkably deteriorate quality of the mask, are minimized (low defect density).

In more detail, the shortness of the exposure wavelength means that the energy density which is irradiated per a unit time is increased at the same time. In accordance with this, it is required that function of the phase shift mask is not degraded by the damage due to the light irradiation in the film material for forming a phase shifter film.

Herein, it is to be noted that the damage means change of the optical characteristics (the refractive index and the transmittance) of the phase shifter film, generation of a color defect, change of a film thickness, and deterioration of film quality, which are caused by the light beam irradiation.

For instance, it has been said that when the excimer laser, which has wavelength in a deep ultraviolet region, is irradiated, substance in the film is exited by the two photons process. This results in the above change of the optical characteristics of the film and the film quality. However, the detail process has not been clarified yet.

At any rate, it is one of essential conditions that the phase shifter has high resistance to irradiation in the irradiation of high energy light beam accompanying with the shortness of the exposure wavelength.

Further, when material of the shifter film is considered from the viewpoint of the mask material, the film should not be deformed or dissolved by the washing due to acid or alkai in the mask manufacturing process. That is, the chemical durability is required for the phase shifter film in spite of length of the exposure wavelength.

Moreover, when the phase shift mask is considered from the viewpoint of a tool for performing a fine process, the fine process characteristic is required to achieve the process (patterning or etching) of the phase shift mask blank at high accuracy. To this end, it is necessary that the phase shifter film is uniform and further, has no defect.

In the meanwhile, it is said that miniaturization of the mask pattern proceeds with the shortness of the exposing wavelength in future. Therefore, reliability of the pattern transferring largely depends upon the defect in the phase shifter film. Thus, the defect in the phase shifter film will become an important problem.

However, the conventional phase shift mask and the blank thereof do not sufficiently satisfy the basic requirement characteristics, such as, the transmittance accompanying with the shortness of the exposure wavelength and the index of the refraction and the above-mentioned other requirement characteristics.

SUMMARY OF THE INVENTION

It is therefore an object of this invention to provide a phase shift mask and a phase shift mask blank which are capable of achieving shortness of an exposure light beam.

This object can be achieved by the following first through fourteenth features of the invention.

First Feature

In a phase shift mask blank for use in manufacturing a half-tone type phase shift mask,
  a semi-transparent film is formed on a transparent substrate,
  the semi-transparent film serves to shift phase of a first optical light beam which transmits the semi-transparent film for a second optical light beam which directly transmits the transparent substrate and further, serves to reduce strength of the first optical light beam,
  the semi-transparent film includes silicon and nickel, and at least one selected from the group consisting of nitrogen, oxygen and hydrogen, and
  the relationship between the silicon and the nickel is specified by a formula in which a rate of [atom % of the nickel in the film] for [atom % of the nickel in the film+atom % of the silicon in the film] falls within the range between 0.15 and 0.5.

Second Feature

In the phase shift blank, at least one selected from the group consisting of the nitrogen, the oxygen and the hydrogen included in the semi-transparent film forms chemical bonding with the silicon.

Third Feature

In a phase shift mask blank for use in manufacturing a half-tone type phase shift mask,
  a semi-transparent film is formed on a transparent substrate,
  the semi-transparent film serves to shift phase of a first optical light beam which transmits the semi-transparent film for a second optical light beam which directly transmits the transparent substrate and further, serves to reduce strength of the first optical light beam, and
  the semi-transparent film includes at least element M selected from the group consisting of a metal and a transition metal, silicon and nickel, and at least one selected from the group consisting of nitrogen, oxygen and hydrogen.

Herein, it is to be noted that the element M represents the metal and the transition metal other than the nickel.

Fourth Feature

In a phase shift mask blank for use in manufacturing a half-tone type phase shift mask,
  a semi-transparent film is formed on a transparent substrate,
  the semi-transparent film serves to shift phase of a first optical light beam which transmits the semi-transparent film for a second optical light beam which directly transmits the transparent substrate and further, serves to reduce strength of the first optical light beam,
  the semi-transparent film includes at least element M selected from the group consisting of a metal and a transition metal, silicon and nickel and at least one selected from the group consisting of nitrogen, oxygen and hydrogen, the element M representing the metal and the transition metal other than the nickel, and
  the relationship between the silicon and the nickel is specified by a formula in which a rate of [atom % of the nickel in the film] for [atom % of the nickel in the film+atom % of the silicon in the film] falls within the range between 0.1 and 0.6.

Fifth Feature

In the phase shift mask blank, at least one selected from the group consisting of the nitrogen, the oxygen and the hydrogen included in the semi-transparent film forms chemical bonding with the silicon.

Sixth Feature

In the phase shift mask blank, the metal or the transition metal which is a main constituent element of the semi-transparent film includes at least one selected from the group consisting of cobalt, tungsten, molybdenum, chromium, vanadium, palladium, titanium, niobium, zinc, zirconium, hafnium, germanium, aluminum, platinum, manganese and iron.

Seventh Feature

In the phase shift mask blank, the semi-transparent film has transmittance of 40% or less for the predetermined inspection light beam for wavelength region of the phase shift mask blank and the phase shift mask within the range between 190 nm and 650 nm.

Eighth Feature

In the phase shift mask blank, content of the nitrogen which is included in the semi-transparent film falls within the range between 0 atom % and 60 atom % while content of the oxygen which is included in the semi-transparent film falls within the range between 0 and 65 atom %.

Ninth Feature

In the phase shift mask blank, the content of the nitrogen falls within the range between 0 atom % and 50 atom % while the content of the oxygen falls within the range between 3 atom % and 50 atom %.

Tenth Feature

In a method of manufacturing the phase shift mask blank, the semi-transparent film is formed on the transparent substrate by the use of the sputtering method using a sputtering target and gas which include constituent elements of the semi-transparent film.

Eleventh Feature

In a method of manufacturing the phase shift mask, the semi-transparent film is processed by the use of the dry-etching using gas containing chlorine and/or gas containing fluorine.

Twelfth Feature

In the phase shift mask, a semi-transparent mask pattern to be transferred on a wafer is formed on the transparent substrate by using the phase shift mask blank.

Thirteenth Feature

In the phase shift mask, the phase shift mask has transmittance between 3% and 20% for the predetermined exposure light beam in wavelength region between 150 nm and 370 nm, and an optical design is carried out in order to serve as the phase shift mask.

Fourteenth Feature

A pattern is transferred by using the phase shift mask.

According to these features, it is possible to use exposure wavelength regions from ultra-violet to deep ultra-violet as a basic condition of these inventions. Therefore, a phase shifter film must have semi-optical transmission for the desired exposure wavelength of 248 nm which is an oscillation wavelength of the krypton fluoride excimer laser or of 193 nm which is the oscillation wavelength of the argon fluoride excimer laser, and for wavelength other than them.

Further, the optical semi-transmission can be controlled in manufacturing the film.

The refractive index relates to a film thickness of the phase shifter, and determines a phase shift angle which is an important factor of the phase shit mask.

For instance, the refractive index is equal to 2, and the film thickness which can realize the phase shift angle of 180° is 124 nm (×N: natural number) in the wavelength of 248 nm. On the other hand, it is equal to 96.5 nm (×N: natural number) in the wavelength of 193 nm in the like manner.

Therefore, the desired semi-transmission is practically required to satisfy the film thickness condition for the predetermined phase shift angle. Consequently, it is extremely important to control these values.

In contrast, this invention particularly satisfies the basic required characteristic, such as, transmittance or the refractive index of the exposure wavelength by containing Ni and controlling and selecting film composition (constituent elements and a rate thereof) and a film quality (including bonding state or film structure).

In addition, the semi-transparent film, which has the desired transmittance for the inspection light beam within the wavelength range between 190 nm and 650 nm, can be obtained.

According to the above first feature, the semi-transparent film contains silicon and nickel, and at least one selected from the group of consisting of nitrogen, oxygen and hydrogen. Further, a rate between the silicon and the nickel is specified by predetermined formula. Thereby, it is possible to satisfy all of the required characteristics as the phase shift mask.

Namely, the semi-transparent film according to the first invention satisfies the required characteristics, such as, the transmittance for wavelength of an inspection light beam, the resistance to an optical beam, chemical durability (resistance to chemical agent) and low defect density other than the transmittance and the refractive index for the exposure wavelength.

In this event, when the rate of [atom % of the nickel in the film] for [atom % of the nickel in the film+atom % of the silicon of the film] is less than 0.15, the optical transmittance is increased in the entire wavelength region, and the transmittance becomes 40% or more in the inspection wavelength region. Consequently, it is difficult to substantially inspect the film.

On the other hand, when the rate is more than 0.5, the transmittance (in particular, near the exposure wavelength) is reduced to degrade function as the phase shifter.

Thus, the rate between the silicon and nickel is selected within the above-mentioned range, and further, at least one selected from the group consisting of nitrogen, oxygen and hydrogen is included. Thereby, it is possible to control the device characteristics, such as, the transmittance and the index of the refraction.

According to the above second feature, the semi-transparent film which satisfies the above first structure is composed of the amorphous structure film containing SiN bonding, Si—O bonding and Si—H bonding. This is preferable to control and improve the required characteristics.

According to the above third feature, the main constituent elements of the semi-transparent film includes four element base or more of at least one selected form the group consisting of metal and/or transition metal, the nickel, nitrogen, oxygen and hydrogen. In consequence, it is possible all of characteristics required as the phase shift mask.

Further, according the third feature, the required characteristic can be readily controlled and improved by adding the metal and/or the transition metal.

According to the fourth feature, the semi-transparent film includes the metal and/or the transition metal M and silicon and nickel and at least one selected from the group consisting of nitrogen, oxygen and hydrogen. In this event, a rate between the silicon and the nickel, which is included is specified by the preselected formula. Consequently, it is possible to satisfy all of characteristics required as the phase shift mask.

In this case, when the rate of [atom % of the nickel in the film] for [atom % of the nickel in the film+atom % of the silicon of the film] is less than 0.1, the optical transmittance is increased in the entire wavelength region, and the transmittance is 40% or more in the inspection wavelength region. Consequently, it is difficult to substantially inspect the film.

On the other hand, the rate is more than 0.6; the transmittance (in particular, near the exposure wavelength) is reduced to degrade function as the phase shifter.

According to the above fifth feature, the semi-transparent film which satisfies the above third or fourth feature is composed of the amorphous structure film containing the Si—N bonding, the Si—O bonding, and the Si—H bonding. This is preferable to control and improve the required characteristics.

According to the above sixth feature, it is possible to satisfy the desired optical characteristic by using these elements as the metal and/or the transition metal M. In addition; it is effective to improve electrical characteristic, the optical characteristic and chemical durability.

Specifically, the electrical characteristic is enhanced by improving conductivity of the film. Further, the optical characteristic is improved by controlling the transmittance in the exposure wavelength and by improving the transmittance in the wavelength region of the inspection light beam of the mask.

Moreover, the chemical durability is enhanced by improving the durability against acid and alkali which are used in the washing process of the mask.

According to the seventh feature, film composition (constituent elements and the rate thereof) or the film quality (bonding structure or film structure) is selected and controlled. Thereby, the semi-transparent film, which has the transmittance of 40% or less for the desired inspection light beam in the wavelength region of the inspection light beam between 190 nm and 650 nm, can be realized. Therefore, the mask, which is capable of performing the inspection having high reliability, can be fabricated.

According to the above eighth feature, when a content the nitrogen exceeds 60 atom %, it is difficult to inspect it because the transmittance is increased in the wavelength region. Further, resistance of the film is increased, and damage, such as charge-up of the film, takes place during the electron ray drawing of the blank.

On the other hand, the content of the oxygen exceeds 65 atom %, it is difficult to inspect it because the transmittance is increased in the wavelength region. In addition, resistivity of the film is increased, and the index of the refraction is reduced. As a result, the electrical and optical characteristic does not satisfy the above requirement.

According to above ninth feature, a preferable content of nitrogen and/or oxygen, which is included in the semi-transparent film, is specified from the viewpoint of the above eighth feature.

According to the above tenth feature, when controllability of the film quality and productivity are considered, it is desirable to form the semi-transparent film by the use of the known sputtering method.

According to the above eleventh feature, an excellent fine process performance can be realized by combining the semi-transparent film obtained in this invention and the dry-etching process using gas containing chlorine and/or gas containing fluorine.

According to the above twelfth feature, the phase shift mask, which satisfies all of the required characteristics, can be obtained by patterning the blank.

According to above thirteenth feature, the phase shift mask, which has the desired optical characteristic, can be realized. In particular, the phase shift mask, which has the desired optical characteristic for the exposure light beams, such as the krypton fluoride (KrF) excimer laser (248 nm), the argon fluoride (ArF) excimer laser (193 nm) and the argon chloride (ArCl) excimer laser (175 nm), can be obtained.

According to the above fourteenth feature, the transferring process corresponding to the shortness of the exposure wavelength can be realized by transferring the pattern using the phase shift mask of this invention.

DESCRIPTION OF THE PREFERRED EMBODIMENT

Now, description will be made about this invention in detail.

According to this invention, main constituent elements of a semi-transparent film (a phase shifter film of half tone type) serve with synergistic effect. Thereby, it is possible to satisfy all of requirement characteristics as the phase shift mask, such as transmittance for wavelength of inspection light beam, resistance to an exposure light beam, chemical durability (resistance to chemical agent), and low defect other than basic requirement characteristics, such as transmittance and refractive index for an exposure wavelength.

Each element itself functions as follows. In this event, it is important to select and control a rate and film quality (including bonding state and film structure) of the constituent element to practically satisfy all of the requirement characteristics in addition to possibility.

Silicon which is included in a semi-transparent film forms nitrogen silicon, oxygen silicon and hydrogen silicon by compounding nitrogen, oxygen and hydrogen which are included in the film. Thereby, the silicon mainly constitutes the semi-transparent film. Consequently, the silicon makes the film structure strong and serves to improve thermal and chemical durability. Herein, it is to be noted that aluminum also takes the same action as the silicon.

Nitrogen, oxygen and hydrogen, which are included in the film, change characteristic as the phase shifter film with itself or combination thereof.

The nitrogen in the film controls the transmittance and further, is effective to mainly change the refractive index.

The oxygen in the film is mainly effective for controlling the transmittance. In particular, it is effective to introduce the oxygen in the semi-transparent film in order to obtain the desired semi-transparent film by controlling optical absorption characteristic and optical transmission characteristic in balance.

However, the introduction of the excess oxygen into the film increases the rate of the oxide in the film and often reduces the refractive index of the semi-transparent film.

As mentioned before, the phase shift angle is determined by the refractive index and the film thickness for the predetermined optical wavelength. In consequence, the reduction of the refractive index means increase of the film thickness required obtaining phase shift angle 180°. As a result, a desired transmittance (transmission quantity) can be obtained.

From theses reasons, it is important to achieve the sufficient transmittance and at the same time, to have a certain degree of refractive index so as to serve as the phase shifter for the desired exposure wavelength.

It is effective to improve the refractive index by introducing nitride into the film by adding the nitrogen in order to avoid reduction of the refractive index due to the excess addition of the oxygen.

The hydrogen in the film effectively controls the transmittance, like the nitrogen and the oxygen. Further, it is also effective to terminate dangling bonds of constituent element in the film and to improve stability of the film for energy light beam of short wavelength, such as ultra violet light. Herein, it is to be noted that it is necessary to determine the introducing quantity by taking both optical and chemical stability into consideration.

Ni in the film is effective to satisfy the basic requirement characteristics, such as the transmittance and the refractive index for the exposure wavelength by selecting and controlling film composition containing Ni (constituent element and the rate thereof) and the film quality (including bonding state or film structure).

In addition, it is particularly effective to obtain the semi-transparent film which has the transmittance of 40% or less for the desired inspection light beam in the wavelength region of the inspection light beam between 190 nm and 650 nm.

Further, the Ni in the film effectively improves the electrical characteristic, the optical characteristic and the chemical durability in the film itself or with the other metal or transition metal elements.

Specifically, the electrical characteristic is enhanced by improving the conductivity of the film while the optical characteristic is improved by controlling the transmittance in the exposure wavelength and by improving the transmittance in the optical wavelength region of the inspection light beam of the mask.

Further, the chemical durability is enhanced by improving durability for acid or alkai used in the washing process of the mask.

The metal or the transition metal elements, which are capable of achieving the desired optical characteristic, may be selected as the metal or the transition metal element M in the film.

Among them, cobalt, tantalum, tungsten, molybdenum, chromium, vanadium, palladium, titanium, niobium, zinc, zirconium, hafnium, germanium, aluminum, platinum, manganese and iron and the like are effective to control and improve the electrical characteristic, the optical characteristic and the chemical durability of the film.

In this case, even when the elements in the film and the rate thereof are the same, it is important to specify the substantial bonding, which is included in the film. This is because the optical characteristic and the other characteristic are achieved by the substantial bonding in the film.

Moreover, it is important that these bonding are included with the desired quantity to achieve the predetermined characteristic, and are uniformly distributed and become the film of the amorphous structure in accordance with the bonding state.

Specifically, when the bonding of at least one selected from the group consisting of the silicon, the nitrogen, the oxygen and the hydrogen become little, it is difficult to improve denseness of the film. On the other hand, the rate of the silicon itself, which is included in the film, becomes large, the chemical durability and the optical characteristic of the film may be reduced.

With respect to the other bonding, the denseness of the film, the chemical durability, the optical characteristic and the resistance to light beam are reduced in dependency upon the presence or absence and quantity thereof.

Stress generated in the film can be controlled to the desired value by the use of the amorphous film structure. Further, it is impossible to occur the phenomenon for optically degrading the transferring characteristic, such as the double refraction or the dispersion. Moreover, the processing performance of the fine pattern is remarkably improved in the lithography step for finally fabricating the mask by the patterning.

It is necessary to select the depositing method and condition of the film; film composition and target composition in order to dominate substantial bonding which is included in the film.

As mentioned before, it is desirable to control and improve the requirement characteristic that the semi-transparent film of this invention substantially contains at least Ni—Si bonding, Ni—Ni bonding, Ni—O bonding or Ni—H bonding, Si—N bonding, Si—O bonding or Si—H bonding, and contains M—Si bonding and M—N bonding as necessary, and is composed of the amorphous structure film.

Herein, it is to be noted that the symbol "—" in each bonding species means the bonding between the atoms, and is not limited to the single bonding, and may be applied to the other bonding state (for example, bonding between single bonding and double bonding).

It is possible to form the other layer, such as a reflection preventing layer, an etching stop layer and an etching mask layer in the shift mask blank as needed. Further, it is necessary that the transparent substrate is transparent for the exposure light beam or the inspection light beam. However, the material is not particularly restricted.

Subsequently, description will be made about a method of manufacturing the phase shift mask blank.

The depositing method of the semi-transparent film includes a variety of thin-film forming method, such as the sputtering deposition method, the vaporizing method, the chemical vapor deposition method (CVD), the ion beam deposition method and the electron beam vaporizing method.

Among them, the sputtering deposition method, which uses a sputtering target and gas containing constituent element of the semi-transparent film, is recently most effective when the productivity, the manufacturing yield and the stability as the mask material are considered.

With regard to the nitrogen, the oxygen and hydrogen among the main constituent element of the semi-transparent film, there are a method of introducing these elements into the film by the use of the reactive sputter method which uses the sputter gas containing these gases, and a method of including these elements in the target and introducing these elements into the film.

When the plasmas discharge (reactive sputter method) is carried out by introducing oxygen gas, abnormal discharge often take places by an insulating oxide formed on a surface of the target. This abnormal discharge is generated on the target surface and causes to occur fine particles. When the particles are entrapped or entered into the semi-transparent film, the quality of the phase shifter is remarkably reduced.

It is possible to contain an oxide in the target in the material base in advance according to this invention. For instance, when the target is consisted of the silicon and the nickel, it is necessary that oxidation silicon or oxidation nickel are included in the target.

In the case of the high frequency discharge, the rate of oxide is restricted because the discharge is possible irrespective of the conductivity of the target.

On the other hand, in the case of a direct current or an alternating discharge, it is required that the oxide is included in the target within the range of the conductivity corresponding to the respective discharge systems.

Thus, it is possible to effectively introduce the oxide into the film with reduction of the abnormal discharge by containing the oxide in the target.

In this event, it is effective to reduce the abnormal discharge in the plasma, which readily brings about during the oxygen reactive sputtering and to reduce the number of the defects in the semi-transparent film by adding the nitrogen or the hydrogen instead of the oxygen.

Regarding the nitrogen, it is possible to effectively introduce the nitride in the film by containing the nitride and oxidation nitride in the target like the oxygen.

In this case, the nitrogen or the hydrogen may be introduced into the film via the sputter gas because it is difficult that the abnormal discharge takes places during the reactive sputter in comparison with the oxygen.

Herein, it is to be noted that the sputter gas includes the nitrogen, the oxygen and the hydrogen, and gas containing them, for example, nitrogen monoxide, carbon dioxide, ammonia gas, ozone and the like.

It is possible to readily entrap the nitrogen, the oxygen and the hydrogen by using these gases themselves or mixing them and by mixing with gases, such as helium, argon and xenon. Finally, the target composition, which can be obtained the goal film composition, the film characteristic and gas composition, is selected.

Further, the sputter condition, such as, the sputter method (the direct current sputter, the high frequency sputter and the alternating current sputter), the sputter output, the gas pressure and the presence or absence of the substrate heating is selected in accordance with the materiel of the semi-transparent film, the goal film composition and the film characteristic.

The phase shift mask can be obtained by using the above-mentioned phase shift mask blank and by forming the semi-transparent mask pattern to be transferred into the wafer on the transparent substrate.

In this event, the semi-transparent film on the blank is patterned by the use of the lithography method. As such lithography method, a method, which is used in the general mask manufacturing process, may be applied.

For instance, with respect to the patterning of the semi-transparent film of this invention, the dry-etching method can be preferably used by mixing gas containing fluoride, such as, $CF_4$, $C_2F_6$, $CHF_3$, $SF_6$ and $NF_3$, gas containing chlorine, such as, $Cl_2$ and $CH_2Cl_2$, and gas containing oxygen, such as, $O_2$, $O_3$ and $H_2O$.

Alternatively, it is effective to control the etching characteristic by mixing argon, hydrogen, helium or the other gases into the above etching gas in the dry etching.

Subsequently, description will be made about various examples according to this invention.

First Example

The sputter target was fabricated by mixing the silicon and the nickel at the rate of about 4:1 by mol and was used in the first example. Further, the semi-transparent film (namely, the half-tone phase shifter film) was formed on a quartz substrate by the use of the known direct current sputter deposition using sputter gas. Herein, the sputter gas was mixed with Ar and $N_2$ at the rate of about 2:8 by flowing rate.

In this event, introducing condition of the sputter gas was selected so that pressure inside an apparatus became 3 mTorr during the sputtering by the use of a pressure adjusting apparatus over an exhausting pump on the condition that total introducing quantity of the mixed gas was set to 30 SCCM.

Figure 3:
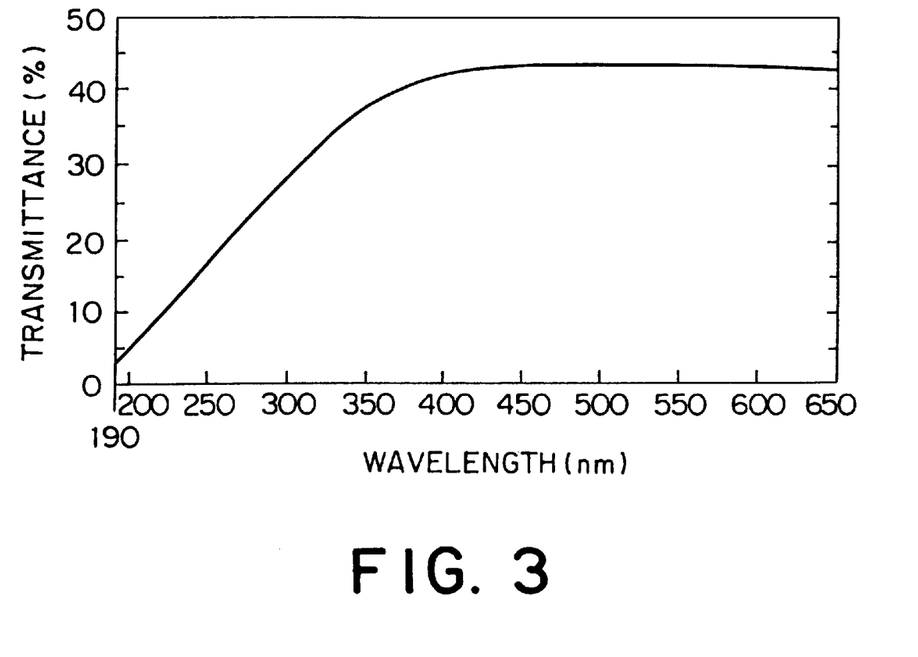
FIG. 3 is a diagram showing spectroscopy transmittance between ultra-violet region and visible light region of a semi-transparent film according to a first example.

With respect to the phase shifter, which is fabricated on the quartz substrate, the film thickness was measured by the use of the stylus method while the transmittance was measured by the use of the spectroscopy photometer. As a result, the film thickness was 770 Å while the spectroscopy transmittance was 3.6% in wavelength of 193 nm, as illustrated in FIG. 3.

Likewise, the index of reflection and the transmittance of the film which was measured by the use of the spectroscopy photometer, and the refractive index (n) from the film thickness were calculated, respectively. As a result, the refractive index (n) was 2.25. It was confirmed that this value was enough to shift the phase of the light beam having the wavelength of 193 nm with 180° in the film thickness of 770 Å.

Further, the spectroscopy transmittance was measured for the inspection light wavelength (364 nm). As a result, the transmittance was 39.6%.

The rate of [atom % of the nickel in the film] for [atom % of the nickel in the film+atom % of the silicon in the film] was 0.25 (25%) as to the fabricated phase shifter. Herein, it is to be noted that the measurement was carried out by the use of the X ray optical-electro spectroscopy method (XPS).

Further, the fabricated phase shifter film was measured in the same manner. In consequence, the content of the nitrogen in the film was 50%.

Moreover, the chemical durability of the fabricated phase shifter film was evaluated by immersing to acid and by the change of the film quality after and before the immersing. The above phase shifter film, which had the spectroscopy transmittance of 3.6% in wavelength of 193 nm and the film thickness of 770 Å, was immersed in thermal concentrated sulphuric acid heated to temperature between 90° C. and 100° C. for 120 minutes.

Thereafter, the measurement was carried out in the same manner as the above case. Consequently, the film thickness was 766 Å while the spectroscopy transmittance was 3.8% in wavelength of 193 nm. In this condition, the deviation of the phase shift angle caused by immersing in acid was within 1°. As a result, the phase shifter film had resistance to the thermal concentrated sulphuric acid.

Likewise, the phase shift film was immersed excess sulphuric acid which is mixed excess oxidation hydrogen water and sulphuric acid with the rate of 1:4 at 120° C. for 120 minutes. In consequence, it was found out that the phase shift film had suffucient resistance to the chemical agent.

With regard to resistance to optical irradiation of the fabricated phase shifter film, the transmittance of the film before and after the irradiation, the refractive index and the film thickness were evaluated by irradiating the ArF excimer laser light beam having oscillation wavelength of 193 nm.

As a result, significant change was not observed for the transmittance, the refractive index and the film thickness before and after the ArF excimer laser of irradiating energy density of 1 mJ/cm$^2$ per an unit pulse was irradiated with 10$^7$ pulses. Thus, the characteristic as the phase shifter film was extremely stable.

The etching of the fabricated phase shifter film was conducted by the use of the reactive ion etching (RIE). In this event, gas, which is mixed chlorine and oxygen by the flow rate of 4:1, was used as the etching gas. In consequence, it was confirmed that the phase shifter film could be excellently etched with etching selectivity of 10 times for the quartz substrate. Further, the etching pattern had a smooth sidewall because the film structure was amorphous.

As described in the above first example, the thin film having both excellent film quality and optical characteristic as the phase shifter could be readily fabricated.

Herein, for comparison, the phase shifter films, which had the rate of [atom % of the nickel in the film] for [atom % of the nickel in the film+atom % of the silicon in the film] of less than 0.15 and exceeding 0.5, were evaluated in the same manner as the above case. As a result, in the case of less than 0.15, the spectroscopy transmittance for the inspection light wavelength exceeded 40%. On the other hand, in the case exceeding 0.5, the spectroscopy transmittance for the exposure wavelength was less than 3%.

Second Example

The sputter target was fabricated by mixing the silicon and the nickel at the rate of about 3:1 by mol and was used in the second example. Further, the semi-transparent film (namely, the half tone phase shifter film) is formed on the quartz substrate by the use of the direct current sputter deposition using the sputter gas. Herein, the sputter gas was mixed Ar, N$_2$ and O$_2$ at the rate of about 10:39:1 by the flowing rate.

In this event, the introducing condition of the sputter gas was selected so that the pressure inside in the apparatus became 3 mTorr during the sputtering by the use of the pressure adjusting apparatus over the exhausting pump on the condition that the total introducing quantity of the mixed gas was set 30 SCCM, like first example.

Regarding the phase shifter, which is fabricated on the quartz substrate, the film thickness was measured by the use of the stylus method while the transmittance was measured by the use of the spectroscopy photometer. As a result, the film thickness was 1010 Å while the spectroscopy transmittance was 38.3% in wavelength of 193 nm, as illustrated in FIG. 3.

Likewise, the index of reflection and the transmittance of the film, which was measured by the use of the spectroscopy photometer, and the refractive index (n) from the film thickness, are calculated, respectively. Consequently, the refractive index (n) was 1.96.

It was confirmed that this value was enough to shift the phase of the light beam having the wavelength of 193 nm with 180° in the film thickness of 1010 Å.

Further, the spectroscopy transmittance was measured for the inspection light wavelength (364 nm). Consequently, the transmittance was 38.8%.

The rate of [atom % of the nickel in the film] for [atom % of the nickel in the film+atom % of the silicon in the film] was 0.32 (32%) concerning the fabricated phase shifter.

Moreover, the fabricated phase shifter film was measured by the use of the above-mentioned XPS. In consequence, the content of the oxygen in the film was 20 atom %.

In addition, the chemical durability of the fabricated phase shifter film was evaluated by the change of the film quality after and before immersing to the acid and the change of the optical characteristic, like the first example.

As a result, the deviation of the phase shift angle before and after immersing to the thermal concentrated sulphuric acid and the excess water sulphuric acid was less than 1°, and the change of the transmittance was less than 0.2. It was confirmed that the phase shifter film was sufficient resistance to chemical agent.

With respect to resistance to optical irradiation of the fabricated phase shifter film, the transmittance, the refractive index and the film thickness were evaluated before and after irradiating the ArF excimer laser having the oscillation wavelength of 193 and energy density of 1 mJ/cm$^2$ per a unit pulse was measured with 10$^7$ pulses, like the first example.

In consequence, significant change was not observed. Thus, the characteristic as the phase shifter film was extremely stable.

The etching of the fabricated phase shifter film was performed by the use of the reactive ion etching (RIE), like the first example. In this event, gas, which is mixed chlorine and oxygen with the flow rate of 9:2, was used as the etching gas.

Consequently, it was found out that the phase shifter film could be excellently etched with etching selectivity of 10 times for the quartz substrate. Further, the etching pattern was the smooth sidewall because the film structure was amorphous.

As mentioned in the above-mentioned second example, the thin-film having both excellent film quality and optical characteristic as the phase shifter could be readily fabricated.

In this event, the transmittance in the exposure wavelength region is improved by introducing the oxygen in the film in the second example. Further, the high refractive index rate is kept by an operation of the nitrogen in the film. In this case, optical absorption characteristic and optical transmission characteristic were controlled by introducing Ni with a certain degree quantity into the film with the excellent balance.

Third Example

The sputter target was fabricated by mixing the silicon and the nickel at the rate of about 3:1 by mol and was used in the third example. Further, the semi-transparent film (namely, the half tone phase shifter film) was formed on the quartz substrate by the use of the direct current sputter deposition using the sputter gas. Herein, the sputter gas is mixed Ar, N$_2$, O$_2$, and H$_2$ at the rate of about 20:74:1:5 by the flowing rate.

In this event, the introducing condition of the sputter gas was selected so that the pressure inside in the apparatus became 3 mTorr during the sputtering by the use of the pressure adjusting apparatus over the exhausting pump on the condition that the total introducing quantity of the mixed gas was set 30 SCCM, like the first example.

With regard to the phase shifter, which is fabricated on the quartz substrate, the film thickness was measured by the use of the stylus method while the transmittance was measured by the use of the spectroscopy photometer. As a result, the film thickness was 885 Å while the spectroscopy transmittance was 7.7% in wavelength of 193 nm.

Likewise, the index of reflection and the transmittance of the film which was measured by the use of the spectroscopy photometer, and the refractive index (n) from the film thickness were calculated, respectively. In consequence, the refractive index (n) was 2.09.

It was confirmed that this value was enough to shift the phase of the light beam having the wavelength of 193 nm with 180° in the film thickness of 885 Å.

Further, the spectroscopy transmittance was measured for the inspection light wavelength (364 nm) in the same manner. Consequently, the transmittance was 39.1%.

The rate of [atom % of the nickel in the film] for [atom % of the nickel in the film+atom % of the silicon in the film] was 0.32 (32%) regarding the fabricated phase shifter.

Moreover, the fabricated phase shifter film was measured by the use of the above-mentioned XPS. In consequence, the content of the oxygen in the film was 24 atom % while the content of the oxygen was 16 atom %.

Herein, it is to be noted that the hydrogen was separately measured by the use of the forward dispersion. As a result, it was found out that the hydrogen was included in the film.

In addition, the chemical durability of the fabricated phase shifter film was evaluated by the change of the film quality and the optical characteristic after and before immersing to the acid, like the first example.

Consequently, the deviation of the phase shift angle before and after immersing the thermal concentrated sulphuric acid and the excess water sulphuric acid was less than 1° and the change of the transmittance was also less than 0.2%. It was confirmed that the phase shifter film was sufficient resistance to chemical agent.

As to resistance to optical irradiation of the fabricated phase shifter film, the changes of the transmittance, the refractive index and the film thickness were measured before and after irradiating the ArF excimer laser having the oscillation wavelength of 193 and irradiating energy density of 1 mJ/cm$^2$ per an unit pulse with $10^7$ pulses, like the first example. In consequence, significant change was not observed.

Thus, the characteristic as the phase shifter film was extremely stable. In this event, it was found out that the stability of the film for the high energy light beam having short wavelength was improved by adding the hydrogen The etching of the fabricated phase shifter film was carried out by the use of the reactive ion etching (RIE), like the first example. In this event, gas, which is mixed chlorine and oxygen with the flow rate of 9:1, was used as the etching gas. As a result, it was confirmed that the phase shifter film could be excellently etched with etching selectivity of 10 times for the quartz substrate. Further, the etching pattern had the smooth sidewall because the film structure was amorphous.

As described in the above-mentioned third example, the thin film having both excellent film quality and optical characteristic as the phase shifter could be easily fabricated.

In this case, the transmittance and the resistance to the light beam are improved by introducing the oxygen and the hydrogen in the film in the third embodiment.

Fourth Embodiment

The sputter target was fabricated by mixing the silicon and the nickel at the rate of about 4:1 by mol and was used in the fourth example. Further, the semi-transparent film (namely, the half tone phase shifter film) was formed on the quartz substrate by the direct current sputter deposition using the sputter gas. Herein, the sputter gas was mixed Ar, $N_2$ and, $H_2$ at the rate of about 2:7:1 by the flowing rate.

In this event, the introducing condition of the sputter gas was selected so that the pressure inside in the apparatus becomes 3 mTorr during the sputtering by the pressure adjusting apparatus over the exhausting pump on the condition that the total introducing quantity of the mixed gas was set to 30 SCCM, like the first example.

With regard to the phase shifter, which is fabricated on the quartz substrate, the film thickness was measured by the use of the stylus method while the transmittance was measured by the spectroscopy photometer. Consequently, the film thickness was 860 Å while the spectroscopy transmittance was 6.5% in 193 nm.

Likewise, the index of reflection and the transmittance of the film which was measured by the spectroscopy photometer and the refractive index (n) from the film thickness were calculated, respectively. As a result, the refractive index (n) was 2.12. It was found out that this value was enough to shift the phase of the light beam having the wavelength of 193 nm with 180° in the film thickness of 860 Å.

Further, the spectroscopy transmittance was measured for the inspection light wavelength (364 nm) in the same manner. Consequently, the transmittance was 37.9%.

In addition, the rate of [atom % of the nickel in the film] for [atom % of the nickel in the film+atom % of the silicon in the film] was 0.25 (25%) concerning the fabricated phase shifter.

Further, the fabricated phase shifter film was measured by the above-mentioned XPS. In consequence, the content of the nitrogen in the film was 40 atom %.

Herein, it is to be noted that the hydrogen was separately measured by the forward dispersion. As a result, it was confirmed that the hydrogen was included in the film.

The chemical durability of the fabricated phase shifter film was evaluated by the change of the film quality and the optical characteristic before and after immersing to the acid, like the first example.

In consequence, the deviation of the phase shift angle before and after immersing the thermal concentrated sulphuric acid and the excess water sulphuric acid was less than 1.5° and the change of the transmittance was also less than 0.3%. It was found out that the phase shifter film had sufficient resistance to chemical agent.

With respect to resistance to optical irradiation of the fabricated phase shifter film, the changes of the transmittance, the refractive index and the film thickness were measured before and after irradiating the ArF excimer laser having the oscillation wavelength of 193 and the irradiating energy density of 1 mJ/cm$^2$ per an unit pulse with $10^7$ pulses, like the first example.

Consequently, significant change was not observed. Therefore, the characteristic as the phase shifter film was extremely stable. In this event, it was confirmed that the stability of the film for the high-energy light beam having short wavelength was improved by adding the hydrogen The etching of the fabricated phase shifter film was conducted by the use of the reactive ion etching (RIE), like the first example. In this event, gas, which is mixed chlorine and oxygen with the flow rate of 9:2, was used as the etching gas. As a result, it was found out that the phase shifter film could be excellently etched with etching selectivity of 12 times for the quartz substrate. Further, the etching pattern was the smooth sidewall because the film structure was amorphous.

As mentioned in the above fourth example, the thin-film having both excellent film quality and optical characteristic as the phase shifter could be readily fabricated.

In this case, both the transmittance and the resistance to the light beam were improved, and the etching selectivity for the quartz substrate was simultaneously enhanced.

Fifth Example

The sputter target was fabricated by mixing the silicon, the nickel and the tantalum at the rate of about 7:1:1 by mol and was used in the fifth example. Further, the semi-transparent film (namely, the half tone phase shifter film) was formed on the quartz substrate by the use of the direct current sputter deposition using the sputter gas. Herein, the sputter gas was mixed Ar and $N_2$ at the rate of about 1:4 by the flowing rate.

In this event, the introducing condition of the sputter gas was selected so that the pressure inside in the apparatus became 3 mTorr during the sputtering by the use of the pressure adjusting apparatus over the exhausting pump on the condition that the total introducing quantity of the mixed gas was set to 30 SCCM, like the first example.

As to the phase shifter, which was fabricated on the quartz substrate, the film thickness was measured by the stylus method while the transmittance was measured by the spectroscopy photometer. In consequence, the film thickness was 750 Å while the spectroscopy transmittance was 4.1% in wavelength of 193 nm.

Likewise, the index of reflection and the transmittance of the film which was measured by the spectroscopy photometer and the refractive index (n) from the film thickness were calculated, respectively. Consequently, the refractive index (n) was 2.29. It was found out that this value was enough to shift the phase of the light beam having the wavelength of 193 nm with 180° in the film thickness of 750 Å.

Further, the spectroscopy transmittance was measured for the inspection light wavelength (364 nm) in the same manner. As a result, the transmittance was 36.1%.

Moreover, the rate of [atom % of the nickel in the film] for [atom % of the nickel in the film+atom % of the silicon in the film] was 0.16 (16%) with regard to the fabricated phase shifter.

In addition, the chemical durability of the fabricated phase shifter film was evaluated by the change of the film quality and the optical characteristic before and after immersing to the acid, like the first example.

As a result, the deviation of the phase shift angle before and after immersing the thermal concentrated sulphuric acid and the excess water sulphuric acid was less than 1.5° and the change of the transmittance was also less than 0.2%. It was confirmed that the phase shifter film had sufficient resistance to chemical agent.

Concerning resistance to optical irradiation of the fabricated phase shifter, the changes of the transmittance, the refractive index and the film thickness were measured before and after irradiating the ArF excimer laser having the oscillation wavelength of 193 and the irradiating energy density of 1 mJ/cm$^2$ per an unit pulse with $10^7$ pulses, like the first example. In consequence, significant change was not observed. Thus, the characteristic as the phase shifter film was extremely stable.

The etching of the fabricated phase shifter film was carried out by the reactive ion etching (RIE), like the first example. In this event, gas, which is mixed chlorine and oxygen with the flow rate of 10:1, was used as the etching gas. As a result, it was confirmed that the phase shifter film could be excellently etched with etching selectivity of about 8.0 times for the quartz substrate. Further, the etching pattern had the smooth sidewall because the film structure was amorphous.

As mentioned in the above fifth example, the control range of the refractive index was widened by the use of four-element base. Further, the thin-film having both excellent film quality and optical characteristic as the phase shifter could be easily fabricated.

Herein, for comparison, the phase shifter films which had the rate of [atom % of the nickel in the film] for [atom % of the nickel in the film+atom % of the silicon in the film] was less than 0.1 and exceeding 0.6 were evaluated in the same manner as the above-mentioned case. In consequence, in the case less than 0.1, the spectroscopy transmittance for the inspection light wavelength exceeded 40%. On the other hand, in the case exceeding 0.6, the spectroscopy transmittance for the exposure wavelength was less than 3%.

Sixth Example

The sputter target was fabricated by mixing the silicon, the oxidation silicon, the nickel and tantalum with the rate of about 5:2:2:1 by mol and was used in the sixth example. Further, the semi-transparent film (namely, the half tone phase shifter film) was formed on the quartz substrate by the direct current sputter deposition using the sputter gas. Herein, the sputter gas was mixed Ar and $N_2$ at the rate of about 4:6 by the flowing rate.

In this event, the introducing condition of the sputter gas was selected so that the pressure inside in the apparatus became 3 mTorr during the sputtering by the use of the pressure adjusting apparatus over the exhausting pump on the condition that the total introducing quantity of the mixed gas was set to 30 SCCM, like first example.

Figure 4:
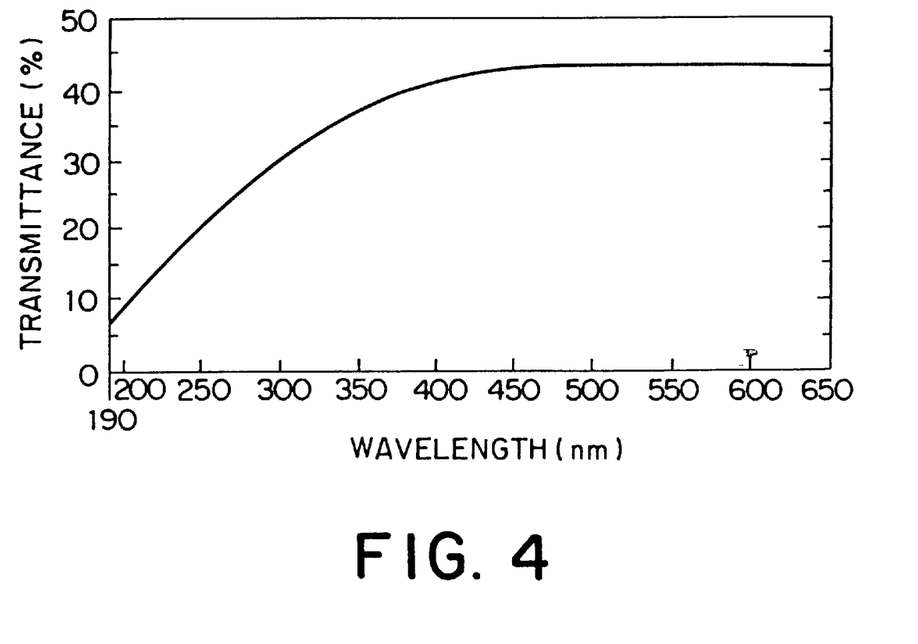
FIG. 4 is a diagram showing spectroscopy transmittance between ultra-violet region and visible light region of a semi-transparent film according to a sixth example.

With regard to the phase shifter, which was fabricated on the quartz substrate, the film thickness was measured by the use of the stylus method while the transmittance was measured by the use of the spectroscopy photometer. In consequence, the film thickness was 910 Å while the spectroscopy transmittance was 7.3% in wavelength of 193 nm, as illustrated in FIG. 4

Likewise, the index of reflection and the transmittance of the film which was measured by the spectroscopy photometer and the refractive index (n) from the film thickness were calculated, respectively. As a result, the refractive index (n) was 2.07. It was found out that this value was enough to shift the phase of the light beam having the wavelength of 193 nm with 180° in the film thickness of 910 Å.

Further, the spectroscopy transmittance was measured for the inspection light wavelength (364 nm) in the same manner. Consequently, the transmittance was 38.2%.

In addition, the rate of [atom % of the nickel in the film] for [atom % of the nickel in the film+atom % of the silicon in the film] was 0.28 (28%) regarding the fabricated phase shifter.

Moreover, the chemical durability of the fabricated phase shifter film was evaluated by the change of the film quality and the optical characteristic before and after immersing to the acid, like the first example.

In consequence, the deviation of the phase shift angle before and after immersing the thermal concentrated sulphuric acid and the excess water sulphuric acid was less than 1° and the change of the transmittance was also less than 0.2%. It was confirmed that the phase shifter film was sufficient resistance to chemical agent.

As to resistance to optical irradiation of the fabricated phase shifter film, the changes of the transmittance, the refractive index and the film thickness were measured before and after irradiating the ArF excimer laser having the oscillation wavelength of 193 and the irradiating energy density of 1 mJ/cm$^2$ per an unit pulse with 10$^7$ pulses, like the first example. As a result, significant change was not observed. Thus, the characteristic as the phase shifter film was extremely stable.

In this event, it was confirmed that stability of the film for the high-energy light beam having short wavelength was improved by adding the hydrogen.

The etching of the fabricated phase shifter film was conducted by the use of the reactive ion etching (RIE), like the first example. In this event, gas, which is mixed chlorine and oxygen with the flow rate of 5:1, was used as the etching gas. As a result, it was confirmed that the phase shifter film could be excellently etched with etching selectivity of 8.5 times for the quartz substrate. Further, the etching pattern was the smooth sidewall because the film structure was amorphous.

As mentioned in the above fourth example, the excellent resistance to the chemical agent could be obtained by the use of the five-element base. Further, the thin-film having both excellent film quality and optical characteristic as the phase shifter could be readily fabricated.

Seventh Example

The sputter target was fabricated by mixing the silicon, the oxidation silicon, the nickel and tantalum with the rate of about 5:2:2:1 by mol and was used in the seventh example. Further, the semi-transparent film (namely, the half tone phase shifter film) was formed on the quartz substrate by the direct current sputter deposition using the sputter gas. Herein, the sputter gas was mixed Ar, N$_2$ and H$_2$ at the rate of about 3:6:1 by the flowing rate.

In this event, the introducing condition of the sputter gas was selected so that the pressure inside in the apparatus became 3 mTorr during the sputtering by the pressure adjusting apparatus over the exhausting pump on the condition that the total introducing quantity of the mixed gas was set to 30 SCCM, like the first example.

Regarding the phase shifter, which is fabricated on the quartz substrate, the film thickness was measured by the use of the stylus method while the transmittance was measured by the use of the spectroscopy photometer. In consequence, the film thickness was 1040 Å while the spectroscopy transmittance was 10.5% in wavelength of 193 nm, as illustrated in FIG. 4.

Likewise, the index of reflection and the transmittance of the film which was measured by the spectroscopy photometer and the refractive index (n) from the film thickness were calculated, respectively. Consequently, the refractive index (n) was 1.93. It was found out that this value was enough to shift the phase of the light beam having the wavelength of 193 nm with 180° in the film thickness of 1040 Å.

Further, the spectroscopy transmittance was measured for the inspection light wavelength (364 nm) in the same manner. As a result, the transmittance was 39.3%.

In addition, the rate of [atom % of the nickel in the film] for [atom % of the nickel in the film+atom % of the silicon in the film] was 0.28 (28%) with regard to the fabricated phase shifter.

Moreover, the chemical durability of the fabricated phase shifter film was evaluated by the change of the film quality and the optical characteristic before and after immersing to the acid, like the first example.

In consequence, the deviation of the phase shift angle before and after immersing the thermal concentrated sulphuric acid and the excess water sulphuric acid was less than 1° and the change of the transmittance was also less than 0.4%. It was found out that the phase shifter film had enough resistance to chemical agent.

Concerning resistance to optical irradiation of the fabricated phase shifter film, the changes of the transmittance, the refractive index and the film thickness were measured before and after irradiating the ArF excimer laser having the oscillation wavelength of 193 nm and the irradiating energy density of 1 mJ/cm$^2$ per an unit pulse with 10$^7$ pulses, like the first example. As a result, significant change was not observed. Thus, the characteristic as the phase shifter film was extremely stable.

In this event, it was confirmed that the stability of the film for the high-energy light beam having short wavelength was improved by adding the hydrogen.

Moreover, the etching of the fabricated phase shifter film was conducted by the use of the reactive ion etching (RIE), like the first example. In this event, gas, which is mixed chlorine and oxygen with the flow rate of 9:2, was used as the etching gas. Consequently, it was confirmed that the phase shifter film could be excellently etched with etching selectivity of 10 times for the quartz substrate. Further, the etching pattern had the smooth sidewall because the film structure was amorphous.

As described in the above seventh example, the transmittance for exposure wavelength was further improved by the use of six-element base. Further, the thin-film having both excellent film quality and optical characteristic as the phase shifter could be readily fabricated.

Eighth Example

Cobalt, tungsten, molybdenum, chromium, vanadium, palladium, titanium, niobium, zinc, zirconium, hafnium, germanium, aluminum, platinum, manganese and iron were used instead of tantalum. Under this circumstance, the evaluation was carried out like the fifth to the seventh examples except that the target composition and the gas composition were suitably adjusted.

As a result, it was confirmed that the thin-film having both excellent film quality and optical characteristic as the phase shifter could be easily fabricated.

Although description has been made about this invention with the above-mentioned examples so far, this invention is not limited to these examples.

For instance, it is required that the sputter target has a certain degree of conductivity to carry out the direct sputtering. However, when it is difficult to use the direct discharge in case that the material of the target includes a semi-insulator or a non-conductor (non-conductivity), the material (for example, boron), which gives conductivity to the target, may be slightly added so as to cause no problem for the characteristic as the phase shifter.

Reversibly, when the target material has excellent conductivity, an insulator or a semiconductor material may be added into the target within the range that does not give damage for the discharge and the film characteristic.

With respect to the discharge method, it is substantially possible to use the high frequency discharge method or the alternating discharge method other than the direct discharge method. In such high frequency discharge method or the alternating discharge method, it is difficult that the plasma discharge gives the desired affect for the conductivity of the target.

At any rate, it is important to excessively reduce defects in the film in manufacturing the desired film.

Further, the gas used in the sputtering is not limited to the substance and the mixed rate described in the examples. For instance, Xe gas or He gas may be used instead of Ar while gas containing the nitrogen, such as $NH_3$, $N_2O$, $NO_2$ and NO, may be used instead of $N_2$ gas.

Alternatively, it is possible that the gas containing these components may be suitably selected and may be used by mixing them.

Moreover, the etching of the phase shifter film is not restricted to the method mentioned in the above-mentioned examples. The etching system, the etching gas and the detail etching conditions can be suitably selected.

In addition, fluorite and the other various glass substrates (for example, phosphorus fluoride acid base glass or boron fluoride acid base glass, and the like) may be used as the transparent substrate instead of the quartz substrate.

What is claimed is:

1. A phase shift mask blank for use in manufacturing a half-tone phase shift mask, comprising:

a transparent substrate; and
   a semi-transparent film formed on said transparent substrate, wherein:
      said semi-transparent film serves to shift the phase of an exposure light beam which transits said semi-transparent film with respect to the phase of an inspection light beam which directly transits said transparent substrate;
      said semi-transparent film serves to reduce the strength of the exposure light beam, the exposure light beam having a first wavelength and a first transmittance and said inspection light beam having a second wavelength longer than said first wavelength and a second transmittance,
      said semi-transparent film includes silicon and nickel, and at least one selected from the group consisting of nitrogen, oxygen and hydrogen, and
      the content of the nickel as a portion of total content of the silicon and the nickel in said semi-transparent film is selected so that the inspection light beam has the second transmittance at a value wherein said phase shift mask blank can be inspected when the inspection light beam has the second wavelength.

2. A phase shift blank as claimed in claim 1, wherein:
   the relationship between the silicon and the nickel is specified by a formula in which a ratio of atom % of the nickel in the film for atom % of the nickel in the film plus atom % of the silicon in the film falls within the range between 0.15 and 0.5.

3. A phase shift blank as claimed in claim 2, wherein:
   at least one selected from the group consisting of the nitrogen, the oxygen and the hydrogen included in said semi-transparent film forms chemical bonding with the silicon.

4. A phase shift blank as claimed in claim 2, wherein:
   the content of the nitrogen which is included in said semi-transparent film falls within the range between 0 atom % and 60 atom % while content of oxygen which is included in said semi-transparent film falls within the range between 0 atom % and 65 atom %.

5. A phase shift blank as claimed in claim 4, wherein:
   the content of the nitrogen falls within the range between 0 atom % and 50 atom % while the content of the oxygen falls within the range between 3 atom % and 50 atom %.

6. A phase shift blank as claimed in claim 1, wherein:
   the second wavelength of the inspection light beam is substantially equal to or near i-line (364 nm) when the first wavelength of the exposure light beam is equal to the oscillating wavelength (248 nm) of a KrF excimer laser light beam, and
   the second wavelength of the inspection light beam is substantially equal to or near the oscillating wavelength (248 nm) of the KrF excimer laser light beam or the i-line (364 nm) when the first wavelength of the exposure light beam is substantially equal to oscillating wavelength (193 nm) of an ArF excimer laser light beam.

7. A phase shift blank as claimed in claim 1, wherein:
   the second transmittance of said semi-transparent film for the inspection light beam is 40% or less.

8. A phase shift blank as claimed in claim 1, wherein:
   the first transmittance of said semi-transparent film for the exposure light beam falls within the range between 3% and 20%.

9. A method of manufacturing said phase shift mask blank claimed in claim 1, comprising:
   placing a transparent substrate in a sputtering chamber; and
   forming a semi-transparent film on the transparent substrate by the use of a sputtering method using a sputtering target and gas which includes constituent elements of said semi-transparent film.

10. A method of manufacturing a phase shift mask as set forth in claim 9, further comprising:
    processing said semi-transparent film by the use of a dry-etching using gas containing chlorine and/or gas containing fluorine.

11. A half-tone phase shift mask, comprising:
    a transparent substrate; and
    a semi-transparent mask pattern to be transcribed on a wafer being formed on said transparent substrate;
    wherein said semi-transparent mask pattern is formed by using said phase shift mask blank claimed in claim 1.

12. A method of transcribing a pattern onto a wafer comprising:
    placing a wafer in a site for irradiation; and
    applying irradiation to said wafer;
    wherein said step of applying comprises passing radiation through a phase shift mask claimed in claim 11.

13. A phase shift mask blank for use in manufacturing a half-tone phase shift mask, comprising:
    a transparent substrate; and
    a semi-transparent film formed on said transparent substrate, wherein:
       said semi-transparent film serves to shift the phase of an exposure light beam which transits said semi-transparent film with respect to the phase of an inspection light beam which directly transits said transparent substrate;
       said semi-transparent film serves to reduce the strength of the exposure light beam, the exposure light beam having a first wavelength and a first transmittance and said inspection light beam having a second wavelength longer than said first wavelength and a second transmittance, said semi-transparent film includes at least element M selected from the group consisting of a metal and a transition metal, silicon and nickel, and at least one selected from the group consisting of nitrogen, oxygen and hydrogen, the element M representing the metal and the transition metal other than the nickel, and the content of the nickel as a portion of total content of the silicon and the nickel in said semi-transparent film is selected so that the inspection light beam has the second transmittance at which said phase shift mask blank can be inspected when the inspection light beam has the second wavelength.

14. A phase shift blank as claimed in claim 13, wherein: the relationship between the silicon and the nickel is specified by a formula in which a ratio of atom % of the nickel in the film for atom % of the nickel in the film plus atom % of the silicon in the film falls within the range between 0.1 and 0.6.

15. A phase shift blank as claimed in claim 14, wherein: at least one selected from the group consisting of the nitrogen, the oxygen and the hydrogen included in said semi-transparent film forms chemical bonding with the silicon.

16. A phase shift blank as claimed in claim 14, wherein: the content of the nitrogen which is included in said semi-transparent film falls within the range between 0 atom % and 60 atom % while the content of oxygen which is included in said semi-transparent film falls within the range between 0 atom % and 65 atom %.

17. A phase shift blank as claimed in claim 16, wherein: the content of the nitrogen falls within the range between 0 atom % and 50 atom % while the content of the oxygen falls within the range between 3 atom % and 50 atom %.

18. A phase shift blank as claimed in claim 13, wherein: the second wavelength of the inspection light beam is substantially equal to or near i-line (364 nm) when the first wavelength of the exposure light beam is equal to oscillating wavelength (248 nm) of a KrF excimer laser light beam, and the second wavelength of the inspection light beam is substantially equal to or near the oscillating wavelength (248 nm) of the KrF excimer laser light beam or the i-line (364 nm) when the first wavelength of the exposure light beam is substantially equal to the oscillating wavelength (193 nm) of an ArF excimer laser light beam.

19. A phase shift blank as claimed in claim 13, wherein: the second transmittance of said semi-transparent film for the inspection light beam is 40% or less.

20. A phase shift blank as claimed in claim 13, wherein: the first transmittance of said semi-transparent film for the exposure light beam falls within the range between 3% and 20%.

21. A phase shift mask blank as claimed in claim 13, wherein:

the metal or the transition metal which is a main constituent element of said semi-transparent film includes at least one selected from the group consisting of cobalt, tantalum tungsten, molybdenum, chromium, vanadium, palladium, titanium, niobium, zinc, zirconium, hafnium, germanium, aluminum, platinum, manganese and iron.

22. A method of manufacturing said phase shift mask blank claimed in claim 13, comprising:

placing a transparent substrate in a sputtering chamber; and forming a semi-transparent film on the transparent substrate by the use of a sputtering method using a sputtering target and gas which includes constituent elements of said semi-transparent film.

23. A method of manufacturing a phase shift mask as set forth in claim 22, further comprising:

processing said semi-transparent film by the use of a dry-etching gas containing chlorine and/or gas containing fluorine.

24. A half-tone phase shift mask, comprising:

a transparent substrate; and a semi-transparent mask pattern to be transcribed on a wafer being formed on said transparent substrate;

wherein said semi-transparent mask pattern is formed by using said phase shift mask blank claimed in claim 13.

25. A method of transcribing a pattern comprising:

placing a wafer in a site for irradiation; and applying irradiation to said wafer;

wherein said step of applying irradiation comprises passing irradiation through a phase shift mask claimed in claim 24.

* * * * *